(12) United States Patent
Enomoto

(10) Patent No.: US 12,481,221 B2
(45) Date of Patent: Nov. 25, 2025

(54) PROJECTION EXPOSURE DEVICE AND PROJECTION EXPOSURE METHOD

(71) Applicant: V TECHNOLOGY CO., LTD., Kanagawa (JP)

(72) Inventor: Yoshiyuki Enomoto, Kanagawa (JP)

(73) Assignee: V TECHNOLOGY CO., LTD., Yokohama (JP)

( * ) Notice: Subject to any disclaimer, the term of this patent is extended or adjusted under 35 U.S.C. 154(b) by 490 days.

(21) Appl. No.: 18/245,133

(22) PCT Filed: Aug. 20, 2021

(86) PCT No.: PCT/JP2021/030630
§ 371 (c)(1),
(2) Date: Mar. 13, 2023

(87) PCT Pub. No.: WO2022/054544
PCT Pub. Date: Mar. 17, 2022

(65) Prior Publication Data
US 2023/0359126 A1 Nov. 9, 2023

(30) Foreign Application Priority Data
Sep. 14, 2020 (JP) .................. 2020-153975

(51) Int. Cl.
*G03F 7/00* (2006.01)
(52) U.S. Cl.
CPC ...... *G03F 7/70358* (2013.01); *G03F 7/70091* (2013.01); *G03F 7/7015* (2013.01); *G03F 7/70258* (2013.01); *G03F 7/70425* (2013.01)
(58) Field of Classification Search
CPC ............ G03F 7/70358; G03F 7/70091; G03F 7/7015; G03F 7/70258; G03F 7/70425;
(Continued)

(56) References Cited

U.S. PATENT DOCUMENTS 5,148,214 A    9/1992   Ohta et al.
5,160,957 A    11/1992   Ina et al.
(Continued)

FOREIGN PATENT DOCUMENTS

JP    62-262426 A    11/1987
JP    2-288324 A    11/1990
(Continued)

OTHER PUBLICATIONS

Cerma Precision Inc. (Year: 2015).*
(Continued)

*Primary Examiner* — Caleen O Sullivan
(74) *Attorney, Agent, or Firm* — Sughrue Mion, PLLC

(57) ABSTRACT

A projection exposure apparatus includes a mask mark illumination light source irradiating a mask mark with exposure light itself or a first alignment light having substantially the same wavelength as the exposure light, and an alignment unit having a work mark illumination light source irradiating a work mark with second alignment light having a wavelength different from the wavelength of the exposure light, an imaging device, and an imaging optical system. The imaging optical system includes a first dichroic prism for synthesizing the first alignment light and the light from the work mark and emitting the synthesized light toward the imaging device, and an optical path length changing optical system for splitting and merging the first alignment light, in which the optical positional relationships of the work mark and the image of the mask mark with respect to the imaging device are equivalent.

5 Claims, 7 Drawing Sheets

(58) Field of Classification Search
CPC ........ G03F 9/7088; G03F 9/00; G03F 9/7046; G03F 9/7084
USPC .................................. 430/30; 355/55, 53, 67
See application file for complete search history.

(56) References Cited

U.S. PATENT DOCUMENTS

| | | |
|---|---|---|
| 5,881,165 A | 3/1999 | Tanaka |
| 2009/0029270 A1* | 1/2009 | Otsuka ................ G03F 7/70433 430/5 |
| 2011/0292362 A1 | 12/2011 | Enomoto et al. |
| 2024/0329549 A1* | 10/2024 | Sohara .................. G03F 9/7088 |

FOREIGN PATENT DOCUMENTS

| | | |
|---|---|---|
| JP | 9-82615 A | 3/1997 |
| JP | 11-251233 A | 9/1999 |
| JP | 2000-147795 A | 5/2000 |
| JP | 2011-253864 A | 12/2011 |
| JP | 2013-21164 A | 1/2013 |
| JP | 2015-135893 A | 7/2015 |

OTHER PUBLICATIONS

Search Report (PCT/ISA/210) issued Oct. 19, 2021 by the International Searching Authority for International Application Patent No. PCT/JP2021/030630.
Written Opinion (PCT/ISA/237) issued Oct. 19, 2021 by the International Searching Authority for International Application Patent No. PCT/JP2021/030630.
Communication issued on Sep. 19, 2025 by the Korean Intellectual Property Office in the corresponding Korean Patent Application No. 10-2023-7008923.

* cited by examiner

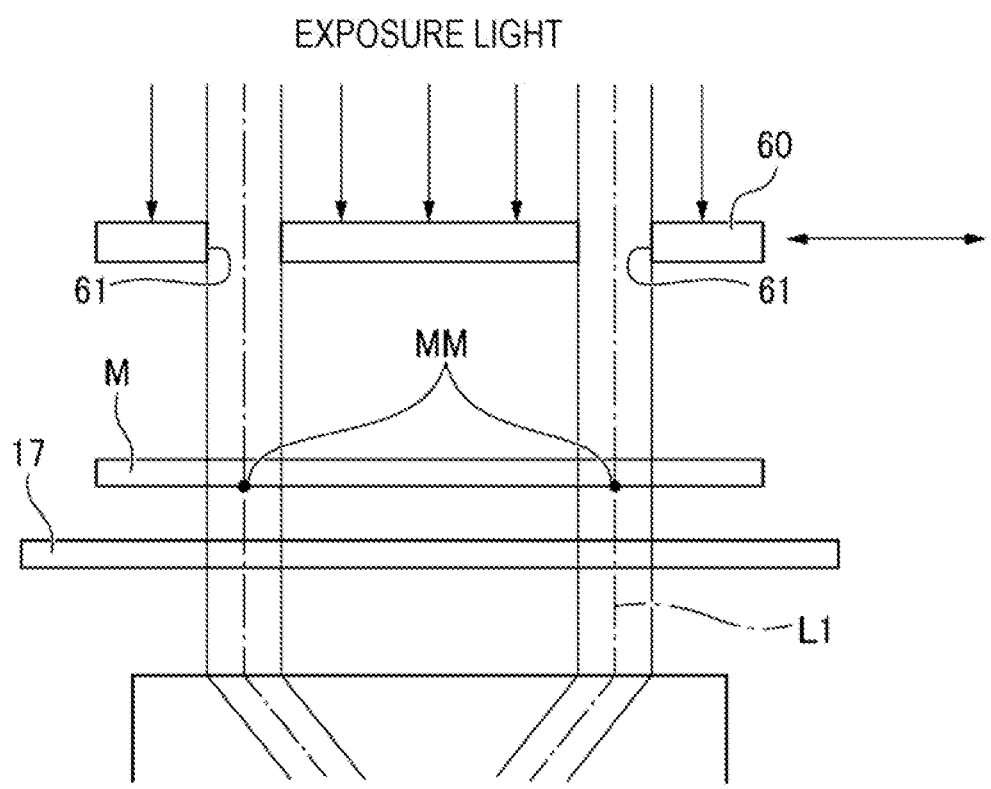

PROJECTION EXPOSURE DEVICE AND PROJECTION EXPOSURE METHOD

CROSS REFERENCE TO RELATED APPLICATIONS

This application is a National Stage of International Application No. PCT/JP2021/030630 filed on Aug. 20, 2021 claiming priority from Japanese Patent Application No. 2020-153975 filed on Sep. 14, 2020, the disclosures of which are incorporated herein in their entirety by reference.

TECHNICAL FIELD

The present invention relates to a projection exposure apparatus and a projection exposure method, and more particularly, to a projection exposure apparatus and a projection exposure method allowing high-precision alignment even in a small-sized exposure area.

BACKGROUND ART

When manufacturing semiconductor wafers, printed wiring boards, liquid crystal substrates, and the like using photolithography technology, a projection exposure apparatus for projecting a pattern of a mask by a projection lens onto a substrate to transfer the pattern onto the substrate is used.

As electronic devices become faster, more multifunctional and smaller, multilayers, high density, and miniaturization are required of the printed wiring boards and the like. Accordingly, when transferring the pattern of the mask onto the work, it is important to precisely align a subsequent pattern to a previously formed pattern. Also, in the projection exposure apparatus, the projection lens is designed to have minimal aberration with respect to ultraviolet light for exposure. Therefore, in a through-the-lens (TTL) alignment method of forming alignment marks of the mask on the work through the projection lens, it is desirable to use the exposure light as the alignment light during alignment. On the other hand, since the resist of the work is sensitive to the ultraviolet light, aligning the alignment light passed through the projection lens without irradiating the work with the light is being studied.

Patent Literature 1 describes an alignment apparatus, in which the mask is irradiated with the exposure light from an exposure light irradiation device, an alignment mark of the mask is projected onto a reflective member provided at a position away from a work fixing area on a work stage, a projected image is received and a relative position thereof is stored. Next, irradiation of the exposure light is stopped, the work stage on which the work is placed is moved to a position where the alignment mark of the mask is projected onto the work, the alignment mark of the work is irradiated with non-exposure light, an image of the alignment mark of the work is received and the relative position thereof is detected. Then, the mask and the work are aligned by moving the work and/or the mask such that the positions of both alignment marks overlap.

Patent Literature 2 describes a projection exposure apparatus, which includes a first illumination system irradiating a reticle alignment mark disposed on a reticle side with exposure illumination light and a second illumination system irradiating a wafer alignment mark disposed on a wafer side with second illumination light having a wider wavelength width than the first illumination light, and which outputs a signal according to a relative positional relationship of the reticle alignment mark and the wafer alignment mark upon detecting images of the reticle alignment mark and wafer alignment mark formed on a light receiving surface by a detection device disposed opposite to the light receiving surface.

Patent Literature 3 describes an exposure apparatus, which includes an alignment illumination unit capable of irradiating a mask-side alignment mark of the mask with alignment light using exposure light, and an alignment camera unit for receiving incoming alignment light that is emitted from the alignment illumination unit and passed through the mask and projection lens. It is described that the alignment camera unit includes an image forming optical system that forms a mask-side alignment mark image in a dummy work area at a position different from the target work and having an optical positional relationship with respect to the mask in the incoming alignment light, which is equivalent to the target work, and an imaging optical system that makes the optical positional relationships of the target work and the dummy work area with respect to an imaging device equivalent, thus achieving extremely high alignment precision.

CITATION LIST

Patent Literature

Patent Literature 1: JP-A-H09-082615
Patent Literature 2: JP-A-H11-251233
Patent Literature 3: JP-A-2011-253864

SUMMARY OF INVENTION

Technical Problem

However, since the alignment apparatus described in Patent Literature 1 performs alignment using a mask alignment mark stored in advance, there is a concern that, if a disturbance such as a temperature change occurs while both alignment marks are obtained, an error due to the disturbance cannot be considered and high-precision alignment can be compromised.

Further, in the exposure apparatuses described in Patent Literatures 2 and 3, since the light receiving surface and the dummy work area on which the alignment mark image of the mask is formed are provided to extend over the exposure area of the work opposite from the detection device and the imaging device, there is a possibility that a plurality of light receiving surfaces and dummy work areas interfere with each other when the alignment marks of a plurality of works are close to each other. In particular, in recent years, for a further miniaturization of the printed wiring boards and the like, there is a need for high-resolution exposure by increasing the number of divisions of the exposure areas, and accordingly, it is desired that alignment is possible even in a small-sized exposure area.

The present invention has been made in view of the problems described above, and an object of the invention is to provide a projection exposure apparatus and a projection exposure method which allow high-precision alignment even in a small-sized exposure area.

Solution to Problem

The above object of the present invention is achieved by the following configurations.

(1) A projection exposure apparatus for irradiating a mask with exposure light, projecting a pattern formed on the mask onto a work by a projection lens, and exposing the work to the pattern, the apparatus including:
   a mask mark illumination light source capable of irradiating an alignment mark of the mask with the exposure light itself or first alignment light having substantially the same wavelength as the exposure light; and
   an alignment unit including
   a work mark illumination light source capable of irradiating an alignment mark of the work with second alignment light having a wavelength different from the wavelength of the exposure light,
   an imaging device that obtains an image of the alignment mark of the mask by the first alignment light and the alignment mark of the work, and an imaging optical system including a synthesizing optical element emitting, toward the imaging device, a synthesized light obtained by synthesizing the first alignment light emitted from the mask mark illumination light source through the mask and the projection lens and a light from the alignment mark of the work, the imaging optical system allowing the imaging device to obtain the image of the alignment mark of the mask and the alignment mark of the work as an image,
   in which the imaging optical system has an optical path length changing optical system for splitting and merging the first alignment light from the first alignment light and the light from the alignment mark of the work synthesized by the synthesizing optical element such that an optical path length of the first alignment light from the synthesizing optical element to the imaging device is longer than an optical path length of the light from the alignment mark of the work from the synthesizing optical element to the imaging device,
   the image of the alignment mark of the mask obtained by the imaging device is formed on the optical path of the optical path length changing optical system, and
   optical positional relationships of the alignment mark of the work and the image of the alignment mark of the mask with respect to the imaging device are equivalent.
(2) A projection exposure method including the projection exposure apparatus described in (1), the method including:
   aligning the mask and the work based on the image of the alignment mark of the mask obtained by the imaging device and the alignment mark of the work; and
   irradiating the mask with exposure light, projecting the pattern formed on the mask onto the work by the projection lens, and exposing the work to the pattern.

Advantageous Effects of Invention

With the projection exposure apparatus and the projection exposure method of the present invention, when alignment is performed using a plurality of alignment units, high-precision alignment is possible without interference between the alignment units even in a small-sized exposure area.

BRIEF DESCRIPTION OF DRAWINGS

FIG. 6 is an enlarged view of a main part illustrating a modification in which exposure light is used as a mask mark illumination light source.

DESCRIPTION OF EMBODIMENTS

An embodiment of a projection exposure apparatus and a projection exposure method according to the present invention will be described in detail below with reference to the drawings.

Figure 1:
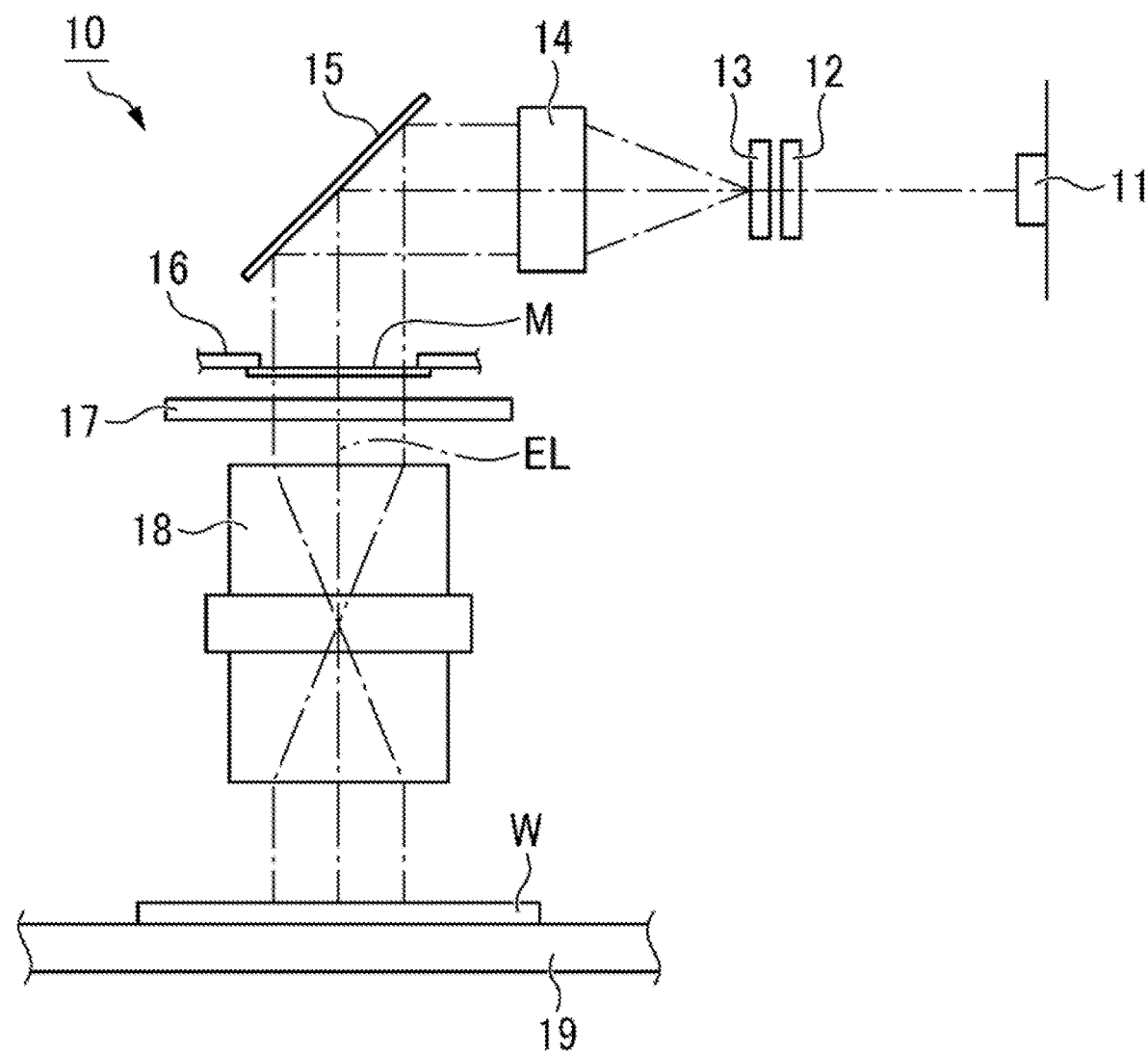
FIG. 1 is an explanatory diagram schematically illustrating a configuration of a projection exposure apparatus according to the present invention.

As illustrated in FIG. 1, a projection exposure apparatus 10 includes a light source unit 11, a bandpass filter 12, an integrator lens 13, a collimator lens 14, a plane mirror 15, a mask stage 16, a correction optical system 17, a projection lens 18, and a work stage 19.

The light source unit 11 is configured by arranging a plurality of LED light sources in a two-dimensional array, for example, and emits light including ultraviolet light, which is exposure light. The bandpass filter 12 blocks light of wavelength bands other than ultraviolet light (for example, i-line). The light transmitted through the bandpass filter 12 enters the integrator lens 13. The integrator lens 13 is an optical system for canceling illuminance unevenness of the incoming light and illuminating the mask M with a uniform illuminance distribution. Furthermore, an aperture stop is disposed on an exit surface of the integrator lens 13. The collimator lens 14 collimates incoming light from the integrator lens 13 to emit parallel light. Then, the collimated exposure light is reflected by the plane mirror 15 and emitted toward the mask M held on the mask stage 16. The exposure light that has passed through the mask M enters the correction optical system 17.

The mask stage 16 holds the patterned mask M movably in a direction orthogonal to the optical axis EL of the exposure light by a mask driving mechanism (not illustrated). Furthermore, four alignment marks MM corresponding to four alignment marks WM of the work W to be described below, are formed on the mask M around the pattern (see FIG. 2).

The correction optical system 17 deforms the pattern image of the mask M formed on the work W according to the distortion of the work W by, for example, arranging a plurality of glass plates in parallel in the optical axis direction and bending or rotating each glass plate as deemed appropriate for correction. In addition, instead of being between the mask stage 16 and the projection lens 18, the correction optical system 17 may be fixed to the projection lens 18 or may be disposed between the projection lens 18 and the work stage 19.

The projection lens 18 appropriately magnifies the image of the pattern formed on the mask M to form a magnified image on the surface of the work W. Further, since the projection lens 18 uses ultraviolet light (i-line) as the exposure light, the projection lens 18 is designed to minimize the aberration with respect to the ultraviolet light (i-line). In this way, the exposure light transmitted through the mask M enters the projection lens 18, and the pattern image of the mask M is formed on the work W coated with a photosensitive material.

Furthermore, in addition to i-line (wavelength of 365 nm), h-line (wavelength of 405 nm), g-line (wavelength of 436 nm), combinations of the respective lines, or wavelengths in between can also be used as exposure light.

The work stage 19 that holds the work W is also movable in a direction orthogonal to the optical axis EL of the exposure light by a work driving mechanism (not illustrated). In particular, in the present embodiment, the work W has a plurality of exposure areas, and step exposure, in which exposure is performed a plurality of times while moving the exposure areas, is performed. Furthermore, examples of the work W include a silicon wafer, a glass substrate, a printed wiring board, and the like.

Next, when the pattern of the mask M is transferred onto the work W by exposure, the alignment between the mask M and the work W is performed prior to the transfer by exposure, which will be described with reference to FIG. 2.

The projection exposure apparatus 10 includes four mask mark illumination units 20 and four alignment units 30 corresponding to each mask mark illumination unit 20. The four mask mark illumination units 20 are provided to respectively correspond to the four alignment marks MM (hereinafter simply referred to as mask marks MM) formed on the mask M, and the four alignment units 30 are provided to respectively correspond to the four alignment marks WM (hereinafter simply referred to as work marks WM) formed on the work W. Since each of the mask mark illumination units 20 and each of the alignment units 30 have the same configuration, these will be described below with reference to one mask mark illumination unit 20 and one alignment unit 30 with reference to FIG. 2.

The mask mark illumination unit 20 is disposed above the mask stage 16. The mask mark illumination unit 20 includes a mask mark illumination light source 21 such as an LED that emits first alignment light (i-line) L1, which is ultraviolet light having the same wavelength as the exposure light, a collimator lens 22, and a reflective prism 23. The collimator lens 22 collimates incoming light to emit parallel light, and the reflective prism 23 changes the travel direction of the ultraviolet light collimated by the collimator lens 22 into a direction orthogonal to the mask M. Furthermore, a reflective mirror may be used instead of the reflective prism 23. Further, the reflective prism 23 or the reflective mirror may not be used, and the mask mark illumination unit 20 may be disposed such that the its optical axis is orthogonal to the mask M.

The mask mark illumination unit 20 is provided to be moved back and forth with respect to the corresponding mask mark MM, and emits the first alignment light L1 toward the corresponding mask mark MM to perform adjustment of alignment with the work W. The first alignment light L1 that is passed through the mask M enters the correction optical system 17 and the projection lens 18.

The alignment unit 30 is provided between the projection lens 18 and the work W to be moved back and forth with respect to the optical path of the first alignment light L1 directed from the projection lens 18 toward the work W. The alignment unit 30 includes an imaging device 32, an imaging optical system 40, and a work mark illumination light source 31.

The imaging device 32 is sensitive at least to the wavelength band of ultraviolet light (i-line), which is the first alignment light L1, and to the wavelength band of visible light, and can simultaneously obtain an image MMI of the mask mark MM of the mask M by the first alignment light L1 and the work mark WM of the work W. The imaging device 32 may be an optical camera, but is preferably a device having an imaging element such as a CCD or CMOS sensor, and photoelectrically converting light received by the imaging element and outputting the converted light as an electric signal.

The imaging optical system 40 is provided for the imaging device 32 to obtain the image MMI of the mask mark MM and the work mark WM as images and includes, in order of proximity to the imaging device 32, an image forming lens unit 33 with built-in half mirror 34 and image forming lens 35, an optical path length changing optical system 42, and a first dichroic prism 41 which is a synthesizing optical element.

The first dichroic prism 41 is an optical element for emitting toward the imaging device 32 synthesized light obtained by synthesizing the first alignment light L1, which is emitted from the mask mark illumination light source 21 and passed through the mask M and the projection lens 18, and the light from the work mark WM of the work W, and is disposed below the projection lens 18 at a position through which the first alignment light L1 is passed.

Figure 3A:
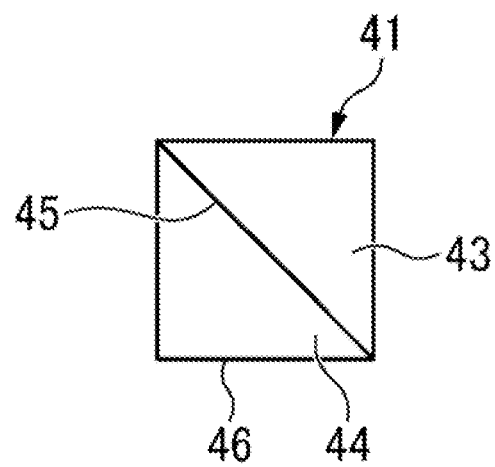
FIG. 3A is an enlarged view of a first dichroic prism.

Also referring to FIG. 3A, the first dichroic prism 41 has a structure in which a pair of prisms 43, 44 are adjoined each other along an adjoining surface 45 inclined at 45° with respect to the optical axis of the first alignment light L1 emitted from the projection lens 18. The adjoining surface 45 forms a so-called half-mirror surface. Further, in the prism 44 disposed beneath the adjoining surface 45, a lower surface 46 orthogonal to the optical axis of the first alignment light L1 forms a dichroic surface that reflects the first alignment light L1 and transmits second alignment light L2. This dichroic surface can prevent the photosensitive material from being exposed to the ultraviolet light by the irradiation of the work W during alignment using the first alignment light L1 which is the ultraviolet light.

The optical path length changing optical system 42 is an optical system that changes the optical path length of the first alignment light L1 by splitting and merging the first alignment light L1 from the first alignment light L1 and the light from the work mark WM synthesized by the first dichroic prism 41. The optical path length changing optical system 42 includes a second dichroic prism 48 disposed on the optical axis LA of the synthesized light emitted from the adjoining surface 45 of the first dichroic prism 41 and a pair of reflective optical elements 49 disposed on a horizontal plane including the optical axis LA of the synthesized light, which are disposed away from the optical axis LA, that is, from the second dichroic prism 48 and in parallel with the optical axis LA of the synthesized light.

Figure 3B:
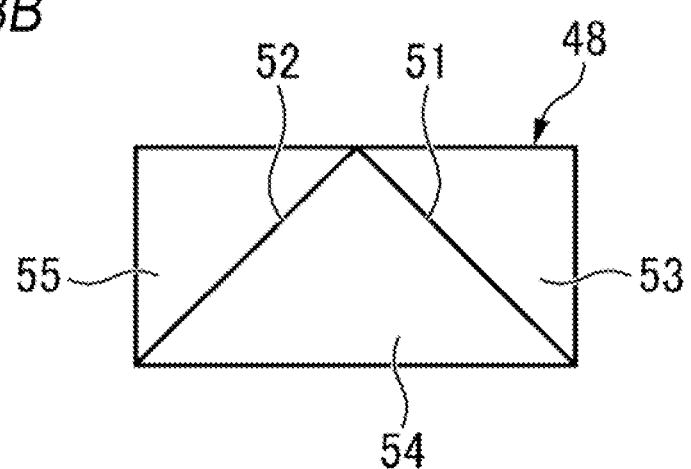
FIG. 3B is an enlarged view of a second dichroic prism.

Also referring to FIG. 3B, a plurality of (three in the embodiment illustrated in the drawing) prisms 53, 54, 55 adjoin each other in the second dichroic prism 48. The two orthogonal adjoining surfaces 51 and 52 respectively formed between the prisms 53, 54, and 55 are respectively inclined at 45° with respect to the optical axis LA of the synthesized light emitted from the adjoining surface 45 of the first dichroic prism 41 and form dichroic surfaces. That is, these adjoining surfaces 51 and 52 also reflect the first alignment light L1 and transmit the second alignment light L2.

The pair of reflective optical elements 49 are formed of a pair of prisms 58 and 59 and have a first reflective surface 56 disposed in parallel with an adjoining surface 51 of the second dichroic prism 48 and a second reflective surface 57 disposed in parallel with the adjoining surface 52 of the second dichroic prism 48, and the first reflective surface 56 and the second reflective surface 57 are orthogonal to each other. Then, the first alignment light L1 reflected by one adjoining surface 51 of the second dichroic prism 48 is reflected by the first reflective surface 56 and the second reflective surface 57 and enters the adjoining surface 52 of the second dichroic prism 48. Accordingly, the optical path length of the first alignment light L1 is changed. Furthermore, the pair of prisms 58 and 59 may be a pair of mirrors.

The work mark illumination light source 31 introduces the second alignment light L2 having a wavelength different from the wavelength of the exposure light such as visible light into the image forming lens unit 33, and the second alignment light L2 is reflected by the half mirror surface 34 inclined at 45° with respect to the optical axis of the second alignment light L2 and emitted coaxially with the optical axis LA of the synthesized light to irradiate the work mark WM of the work W via the second dichroic prism 48 and the first dichroic prism 41. That is, the second alignment light L2 introduced from the image forming lens unit 33 forms coaxial epi-illumination that is quasi-disposed on the optical axis LA of the synthesized light.

Furthermore, the work mark WM sometimes appears different depending on the type of photosensitive material applied to the work W. For this reason, an optical filter (not illustrated) capable of converting to light of a wavelength that is more visible according to the type of photosensitive material can be provided in the work mark illumination light source 31.

Figure 2:
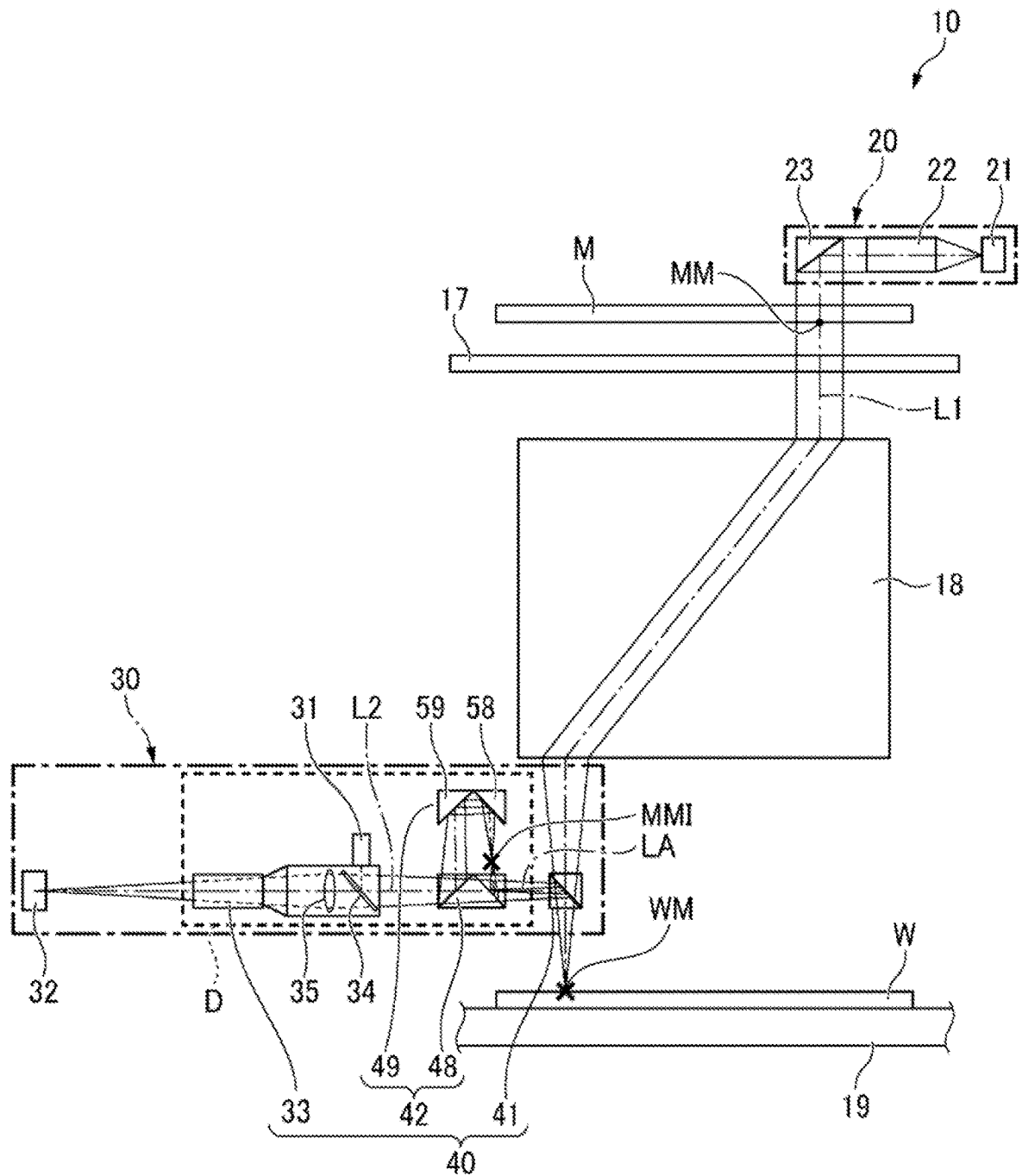
FIG. 2 is a schematic diagram illustrating a state of adjusting alignment using exposure light with a TTL method.

Further, for the convenience of description of the optical path, FIG. 2 depicts the work mark illumination light source 31 and the reflective optical element 49 protruding upward, but the work mark illumination light source 31, the image forming lens unit 33, the second dichroic prism 48, and the reflective optical element 49 disposed inside the dotted line D in FIG. 2 are in fact disposed in a rotated state around the optical axis LA of the synthesized light by 90°. That is, the work mark illumination light source 31 and the reflective optical element 49 are disposed on the horizontal plane including the optical axis LA of the synthesized light, and specifically, when viewed from above, the work mark illumination light source 31 is attached to a side surface of the image forming lens unit 33, and the reflective optical element 49 is disposed to a side of the second dichroic prism 48. Accordingly, the alignment unit 30 is movable back and forth in the space between the projection lens 18 and the work W without interfering with the projection lens 18 or the work W.

Figure 4A:
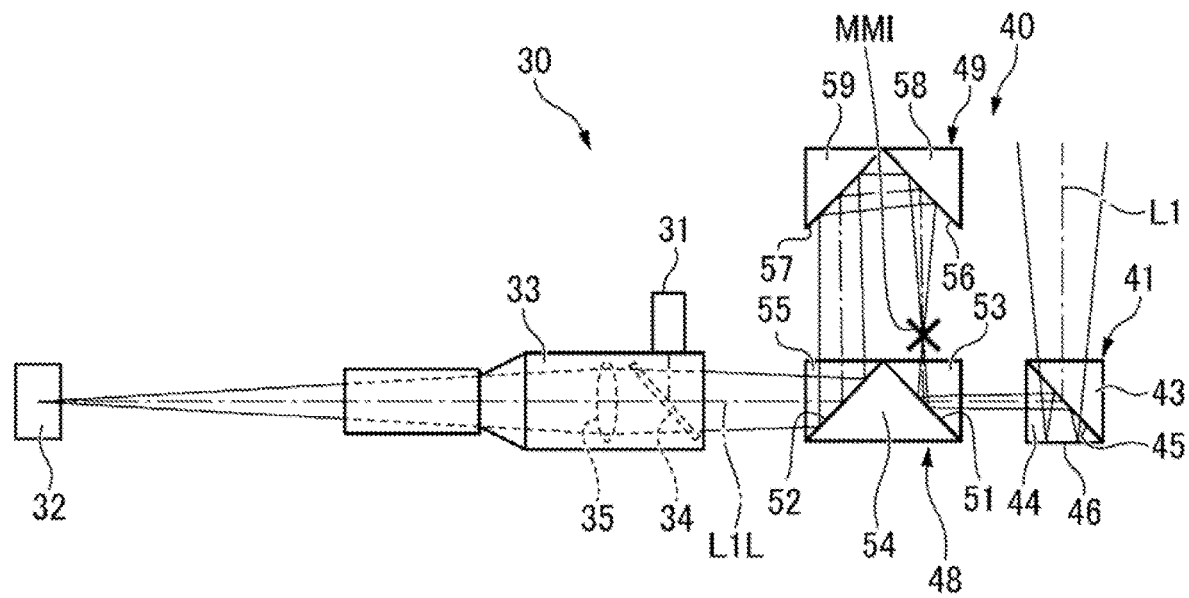
FIG. 4A is a schematic diagram illustrating a state in which first alignment light emitted from a mask mark illumination light source and passed through a projection lens enters an imaging device via an imaging optical system including an optical path length changing optical system.

In the imaging optical system 40 having the above configuration, as illustrated in FIG. 4A, the first alignment light L1 transmitted through the projection lens 18 is reflected by the lower surface 46 forming the dichroic surface of the first dichroic prism 41 and then further reflected by the adjoining surface 45 to enter the second dichroic prism 48. The first alignment light L1 entering the second dichroic prism 48 is reflected by the adjoining surface 51 of the second dichroic prism 48, is reflected by the first reflective surface 56 and the second reflective surface 57 of the reflective optical element 49, and enters the adjoining surface 52 of the second dichroic prism 48. The first alignment light L1 reflected by the adjoining surface 52 is passed through the half mirror 34 and the image forming lens 35 in the image forming lens unit 33 to reach the imaging device 32.

Figure 4B:
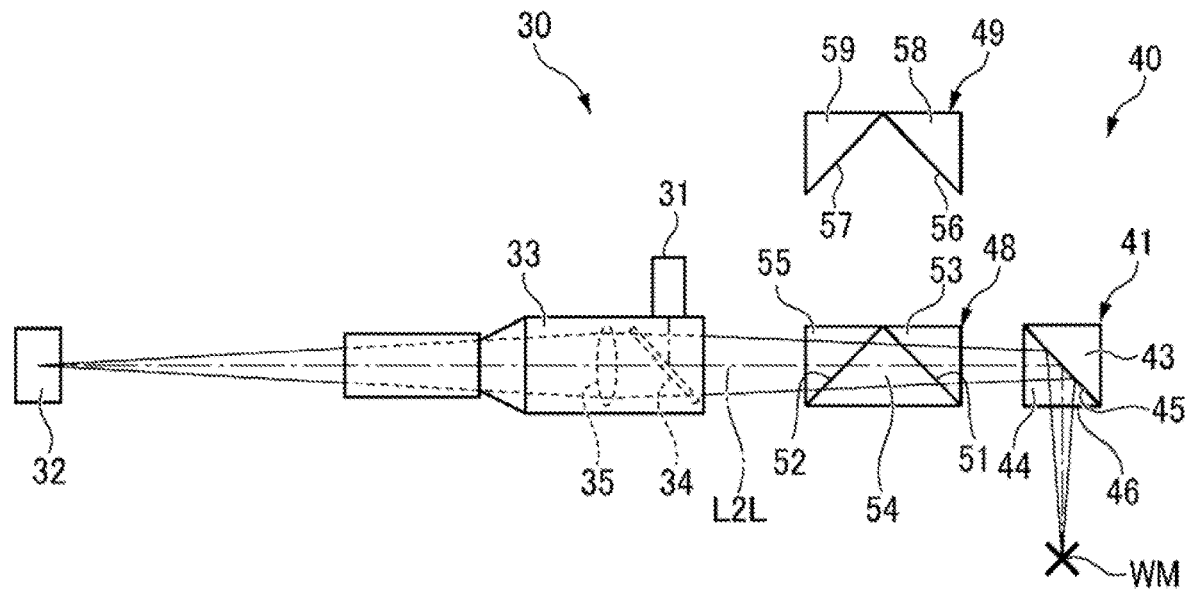
FIG. 4B is a schematic diagram illustrating a state in which light from an alignment mark of a work illuminated by a work mark illumination light source enters the imaging device via the imaging optical system.

On the other hand, as illustrated in FIG. 4B, the light from the work mark WM illuminated with the second alignment light L2 is reflected by the adjoining surface 45 of the first dichroic prism 41, and then passed through the adjoining surfaces 51 and 52 of the second dichroic prism 48 and the half mirror 34 and the image forming lens 35 in the image forming lens unit 33 to reach the imaging device 32. Therefore, from the second dichroic prism 48 to the imaging device 32, the light is synthesized light again by the merging of the first alignment light L1 and the light from the work mark WM.

In this way, by disposing the optical path length changing optical system 42 (the second dichroic prism 48 and the reflective optical element 49) between the first dichroic prism 41 and the imaging device 32, the optical path length of the first alignment light L1 from the first dichroic prism 41 to the imaging device 32 can be longer than the optical path length of the light from the work mark WM from the first dichroic prism 41 to the imaging device 32. Then, an image MMI of the mask mark MM is formed on the optical path of the optical path length changing optical system 42. Accordingly, since the image MMI of the mask mark MM is an aerial image on the optical path of the optical path length changing optical system 42, there is little concern about adhesion of foreign matter and the like, and the image can be obtained by the imaging device 32 with high precision.

The optical path length changing optical system 42 sets the optical positional relationships of the work mark WM and the image MMI of the mask mark MM with respect to the imaging device 32 to be equivalent, by setting an optical path length L1L, illustrated in FIG. 4A, from the image MMI of the mask mark MM formed on the optical path of the first alignment light L1 to the imaging device 32 (strictly speaking, image receiving surface of the imaging device 32) to be same as an optical path length L2L, illustrated in FIG. 4B, from the work mark WM to the imaging device 32, so that the imaging device 32 can capture the image MMI of the mask mark MM and the work mark WM provided on the work W in the same field of view. That is, the image MMI of the mask mark MM and the imaging device are in an optically conjugate positional relationship on the optical path of the first alignment light L1, and the work mark WM and the imaging device 32 are in an optically conjugate positional relationship on the optical path of the second alignment light L2.

Then, the mask M and the work W are aligned by correcting the position and shape of the image MMI of the mask mark MINI by the correction optical system 17 so that the image MMI of the mask mark MINI and the work mark WM match, while moving the relative position of the mask M and the work W as needed based on the positional relationship of the image MMI of the mask mark MINI and the work mark WM in the field of view of the imaging device 32.

Since the alignment operation described above is performed each time one exposure area EA is exposed, the influence of disturbance between the alignment operation and the exposure operation can be greatly prevented, and the pattern of the mask M can be transferred by exposure with high precision.

Figure 5A:
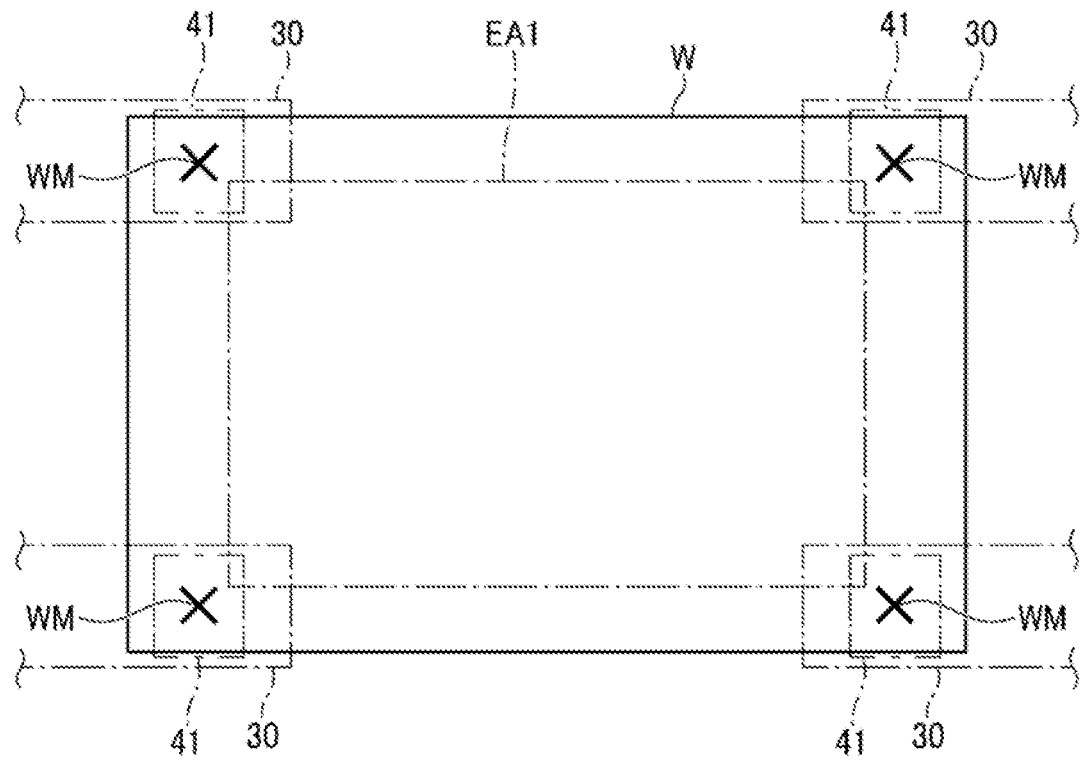
FIG. 5A is a view that illustrates, together with the alignment unit, the arrangement of four alignment marks of the work at four corners of a large exposure area.
Figure 5B:
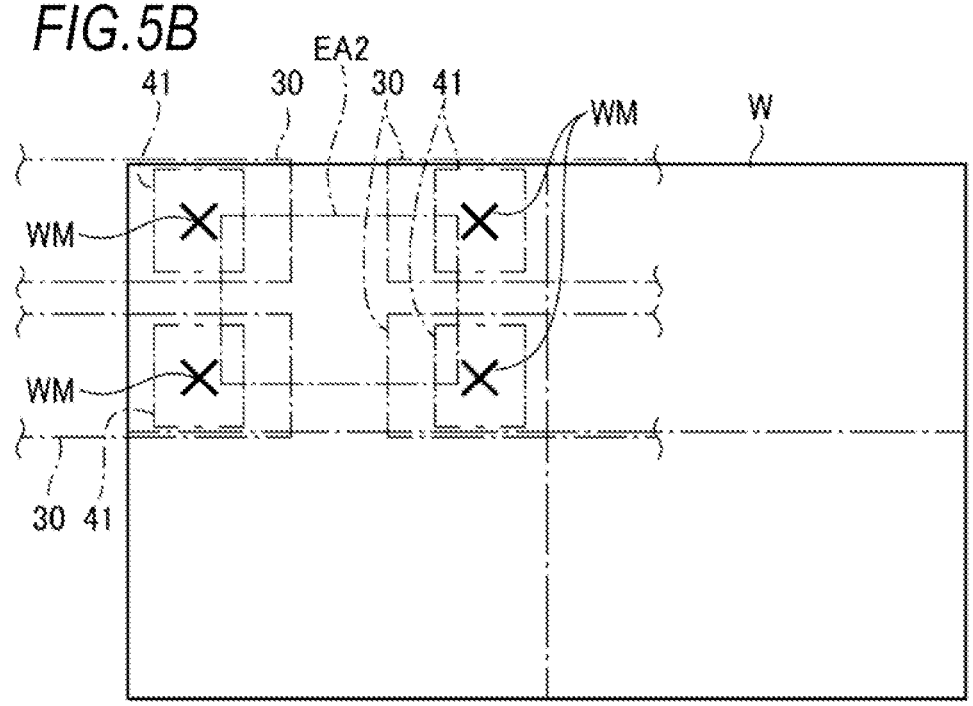
FIG. 5B is a view that illustrates, together with the alignment unit, the arrangement of four alignment marks of the work at four corners of a small-sized exposure area that corresponds to one-fourth of the exposure area of FIG. 5A.

As illustrated in FIGS. 5A and 5B, a total of four work marks WM, one in each of the four corners of the exposure area EA, are provided in each exposure area EA set in the work W. It is necessary to position the four alignment units 30 respectively on the work marks WM to simultaneously capture the four work marks WM with the imaging device 32.

In particular, in a small-sized exposure area EA2 illustrated in FIG. 5B, which corresponds to one-fourth of an exposure area EA1 illustrated in FIG. 5A, the distance between the work marks WM is also decreased. Even in the exposure area EA2 in which the work marks WM are disposed close to each other, since the alignment unit 30 has no optical system on a side opposite to the imaging device 32 with respect to the first dichroic prism 41, it is possible to bring a plurality of alignment units 30 close to each other. Therefore, it is possible to handle even a small-sized exposure area EA, and contribute greatly to miniaturization and high-resolution exposure of the printed wiring boards and the like.

As described above, the projection exposure apparatus 10 of the present embodiment allows extremely high-precision alignment even for a small-sized exposure area EA, by using the TTL alignment method in which the ultraviolet light (i-line), which is the same as the exposure light, is transmitted through the projection lens 18.

It should be noted that the present invention is not limited to the embodiments described above, but may encompass modifications or improvements, as appropriate.

For example, although the embodiment has been described above with reference to an example in which there are four alignment marks of the mask and four alignment marks of the work respectively, there may be three alignment marks of the mask and three alignment marks of the work respectively to perform the alignment of the mask and the work.

Further, in the embodiment described above, for the mask mark illumination light source for irradiating the alignment marks of the mask during alignment, a light source for irradiating the first alignment light L1, which has substantially the same wavelength as the exposure light, is provided separately from the light source unit 11. However, the present invention is not limited thereto, and for example, the exposure light itself irradiated from the light source unit 11 may be used as the first alignment light L1 to irradiate the alignment mark of the mask. That is, the light source unit 11 may be used as a mask mark illumination light source.

When the alignment marks MINI of the mask M is irradiated with the exposure light, one light blocking plate 60 that can advance above the mask M during alignment may also be used, as in the modification illustrated in FIG. 6. For example, if there are four observation points, four holes 61 are formed in the light blocking plate 60 at positions corresponding to the respective alignment marks MM of the mask M (only two holes are illustrated in FIG. 6). When alignment is performed, the light blocking plate 60 advances above the mask M, shielding the exposure area from the irradiated exposure light, while permitting each alignment mark MM to be irradiated with the exposure light through the four holes 61. Further, when the alignment is completed and then exposure is performed, the light blocking plate 60 retracts from above the mask M.

Figure 7A:
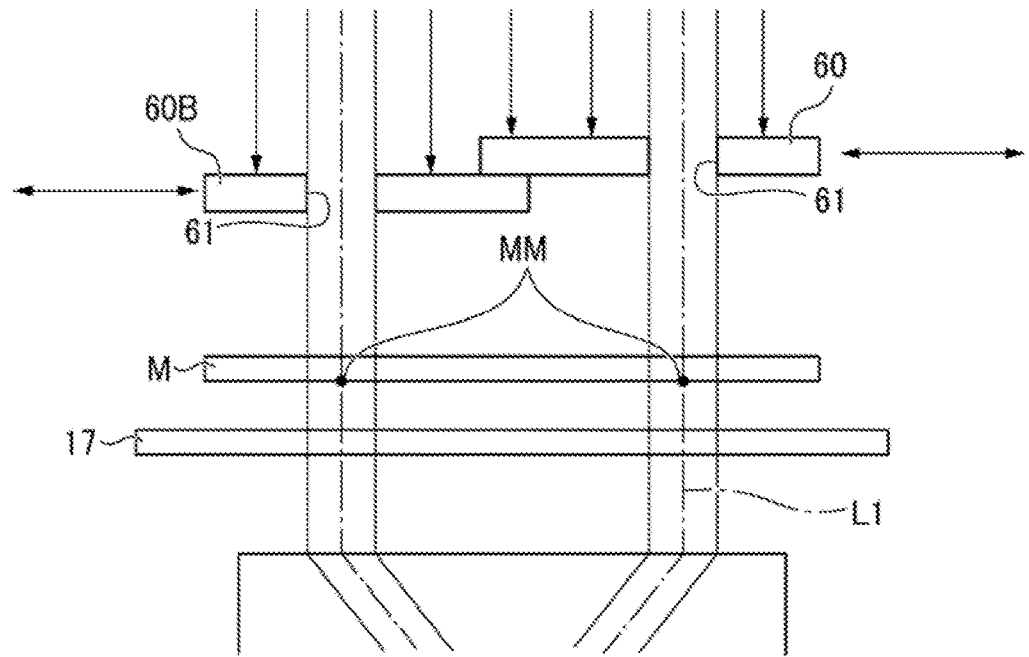
FIG. 7A is an enlarged view of a main part illustrating another modification in which exposure light is used as a mask mark illumination light source.
Figure 7B:
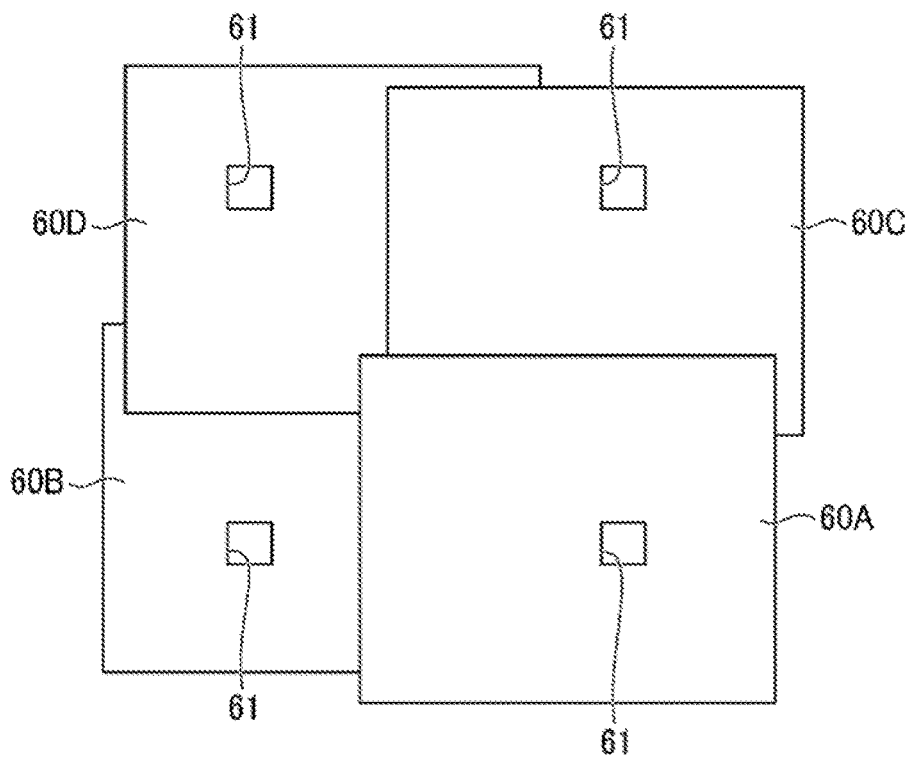
FIG. 7B is a top view illustrating a plurality of light blocking plates.

Further, when there are four observation points as in another modification illustrated in FIGS. 7A and 7B, four light blocking plates 60A to 60D that respectively have one hole 61 corresponding to each alignment mark MINI of the mask M and that can advance above the mask M may be used together. Accordingly, even the changes in the positions of respective alignment marks MMI according to the mask M can be taken care of without changing the light blocking plates 60A to 60D by moving the positions of the respective light blocking plates 60A to 60D according to the positions of the respective alignment marks MM.

Further, the present invention preferably uses a work mark illumination light source that can reduce the height dimension of the alignment unit as in the present embodiment, but other work mark illumination light sources such as ring illumination may be used when the height dimension is not limited.

As described above, the present specification discloses the following.

(1) A projection exposure apparatus for irradiating a mask with exposure light, projecting a pattern formed on the mask onto a work by a projection lens, and exposing the work to the pattern, the apparatus including:
a mask mark illumination light source capable of irradiating alignment marks of the mask with the exposure light itself or first alignment light having substantially the same wavelength as the exposure light; and
an alignment unit including
a work mark illumination light source capable of irradiating an alignment mark of the work with second alignment light having a wavelength different from the wavelength of the exposure light,
an imaging device that obtains an image of the alignment mark of the mask by the first alignment light and the alignment mark of the work, and an imaging optical system including a synthesizing optical element emitting, toward the imaging device, a synthesized light obtained by synthesizing the first alignment light emitted from the mask mark illumination light source through the mask and the projection lens and a light from the alignment mark of the work, the imaging optical system allowing the imaging device to obtain the image of the alignment mark of the mask and the alignment mark of the work as an image,
in which the imaging optical system has an optical path length changing optical system for splitting and merging the first alignment light from the first alignment light and the light from the alignment mark of the work synthesized by the synthesizing optical element such that an optical path length of the first alignment light from the synthesizing optical element to the imaging device is longer than an optical path length of the light from the alignment mark of the work from the synthesizing optical element to the imaging device,
the image of the alignment mark of the mask obtained by the imaging device is formed on the optical path of the optical path length changing optical system, and
optical positional relationships of the alignment mark of the work and the image of the alignment mark of the mask with respect to the imaging device are equivalent.

According to this configuration, when alignment is performed using a plurality of alignment units, high-precision alignment can be performed without interference between the alignment units even in a small-sized exposure area.

(2) The projection exposure apparatus described in (1), in which the synthesizing optical element is a first dichroic prism having a pair of prisms whose adjoining surfaces inclined at 45° with respect to an optical axis of the first alignment light emitted from the projection lens forms a half mirror surface, and
in the prism facing the work, a surface orthogonal to the optical axis of the first alignment light forms a dichroic surface that reflects the first alignment light and transmits the second alignment light.

According to this configuration, the work can be prevented from being irradiated with the first alignment light having substantially the same wavelength as the exposure light, and the first alignment light and the second alignment light can be synthesized to obtain a synthesized light.

(3) The projection exposure apparatus described in (1) or (2), in which the optical path length changing optical system includes:

a second dichroic prism including a plurality of prisms whose two adjoining surfaces respectively inclined at 45° with respect to the optical axis of the synthesized light emitted from the synthesizing optical element and forming dichroic surfaces reflecting the first alignment light and transmitting the second alignment light are orthogonal to each other; and a pair of reflective optical elements respectively provided at positions away from the optical axis of the synthesized light emitted from the synthesizing optical element and having reflective surfaces orthogonal to each other such that the first alignment light reflected by one adjoining surface of the second dichroic prism enters the other adjoining surface of the second dichroic prism.

According to this configuration, it is possible to change the optical path length of the first alignment light by separating the first alignment light from the synthesized light emitted from the synthesizing optical element.

(4) The projection exposure apparatus described in (3), in which the alignment unit is provided to be horizontally movable back and forth between the projection lens and the work, and the work mark illumination light source and the pair of reflective optical elements are disposed on a horizontal plane including the optical axis of the synthesized light emitted from the synthesizing optical element.

According to this configuration, the height dimension of the alignment unit can be reduced, so that the alignment unit can be moved in the space between the projection lens and the work without being interfered with the projection lens or the work, and further, the alignment unit can be retracted during transfer by exposure.

(5) A projection exposure method including the projection exposure apparatus described in any one of (1) to (4), the method including:

aligning the mask and the work based on the image of the alignment mark of the mask obtained by the imaging device and the alignment mark of the work; and irradiating the mask with exposure light, projecting the pattern formed on the mask onto the work by the projection lens, and exposing the work to the pattern.

According to this configuration, when alignment is performed using a plurality of alignment units, high-precision alignment can be performed without interference between the alignment units even in small-sized exposure areas so that high-resolution exposure can be realized with increased number of divisions of the exposure area.

REFERENCE SIGNS LIST

10: projection exposure apparatus
18: projection lens
21: mask mark illumination light source
30: alignment unit
31: work mark illumination light source
32: imaging device
40: imaging optical system
41: first dichroic prism (synthesizing optical element)
42: optical path length changing optical system
43, 44: prisms
45: adjoining surface (half mirror surface)
46: lower surface (dichroic surface)
48: second dichroic prism
49: reflective optical element
51, 52: adjoining surfaces (dichroic surfaces)
53, 54, 55: prisms
56: first reflective surface (reflective surface)
57: second reflective surface (reflective surface)
60, 60A to 60D: light blocking plates
L1: first alignment light
L2: second alignment light
LA: optical axis of synthesized light
M: mask
MM: mask mark (alignment mark of mask)
MMI: image of alignment mark of mask
W: work
WM: work mark (alignment mark of work)

The invention claimed is:

1. A projection exposure apparatus for irradiating a mask with exposure light, projecting a pattern formed on the mask onto a work by a projection lens, and exposing the work to the pattern, the projection exposure apparatus comprising:

a mask mark illumination light source capable of irradiating an alignment mark of the mask with the exposure light itself or first alignment light having substantially the same wavelength as the exposure light; and an alignment unit including:

a work mark illumination light source capable of irradiating an alignment mark of the work with second alignment light having a wavelength different from the wavelength of the exposure light;

an imaging device that obtains an image of the alignment mark of the mask by the first alignment light and the alignment mark of the work; and an imaging optical system including a synthesizing optical element emitting, toward the imaging device, a synthesized light obtained by synthesizing the first alignment light emitted from the mask mark illumination light source through the mask and the projection lens and a light from the alignment mark of the work, the imaging optical system allowing the imaging device to obtain the image of the alignment mark of the mask and the alignment mark of the work as an image, wherein:

the imaging optical system has an optical path length changing optical system for splitting and merging the first alignment light from the first alignment light and the light from the alignment mark of the work synthesized by the synthesizing optical element such that an optical path length of the first alignment light from the synthesizing optical element to the imaging device is longer than an optical path length of the light from the alignment mark of the work from the synthesizing optical element to the imaging device;

the image of the alignment mark of the mask obtained by the imaging device is formed on the optical path of the optical path length changing optical system; and optical positional relationships of the alignment mark of the work and the image of the alignment mark of the mask with respect to the imaging device are equivalent.

2. The projection exposure apparatus according to claim 1, wherein:

the synthesizing optical element is a first dichroic prism having a pair of prisms whose adjoining surfaces inclined at 45° with respect to an optical axis of the first alignment light emitted from the projection lens forms a half mirror surface; and in the prism facing the work, a surface orthogonal to the optical axis of the first alignment light forms a dichroic surface that reflects the first alignment light and transmits the second alignment light.

3. The projection exposure apparatus according to claim 1, wherein:

the optical path length changing optical system includes:
a second dichroic prism including a plurality of prisms whose two adjoining surfaces respectively inclined at 45° with respect to the optical axis of the synthesized light emitted from the synthesizing optical element and forming dichroic surfaces reflecting the first alignment light and transmitting the second alignment light are orthogonal to each other; and a pair of reflective optical elements respectively provided at positions away from the optical axis of the synthesized light emitted from the synthesizing optical element and having reflective surfaces orthogonal to each other such that the first alignment light reflected by one adjoining surface of the second dichroic prism enters the other adjoining surface of the second dichroic prism.

4. The projection exposure apparatus according to claim 3, wherein:

the alignment unit is provided to be horizontally movable back and forth between the projection lens and the work; and the work mark illumination light source and the pair of reflective optical elements are disposed on a horizontal plane including the optical axis of the synthesized light emitted from the synthesizing optical element.

5. A projection exposure method including the projection exposure apparatus according to claim 1, the method comprising:

aligning the mask and the work based on the image of the alignment mark of the mask obtained by the imaging device and the alignment mark of the work; and irradiating the mask with exposure light, projecting the pattern formed on the mask onto the work by the projection lens, and exposing the work to the pattern.

* * * * *